United States Patent [19]
Mizuguchi et al.

[11] Patent Number: 5,853,805
[45] Date of Patent: Dec. 29, 1998

[54] APPARATUS AND PROCESS FOR FORMING ELECTRODES OF ELECTRONIC COMPONENTS

[75] Inventors: Takashi Mizuguchi; Shushi Saoshita; Manabu Sumita, all of Toyama, Japan

[73] Assignee: Murata Manufacturing Co., Ltd., Kyoto-fu, Japan

[21] Appl. No.: 717,930

[22] Filed: Sep. 23, 1996

[30] Foreign Application Priority Data

Sep. 28, 1995 [JP] Japan ................................. 7-276552

[51] Int. Cl.⁶ ............................. B05D 5/12; C23C 16/00; C23C 14/00
[52] U.S. Cl. ......................... 427/250; 427/124; 427/282; 427/576; 204/192.1; 204/192.17
[58] Field of Search ..................... 427/468, 504, 427/510, 526, 562, 569, 576, 124, 126.1, 282, 250; 118/504, 301, 406, 723 E; 204/192.1, 192.17

[56] References Cited

U.S. PATENT DOCUMENTS 4,084,506  4/1978  Nakatani ................................. 101/127
4,252,839  2/1981  Wakasugi .

FOREIGN PATENT DOCUMENTS 204-110  11/1983  Germany .

OTHER PUBLICATIONS

Kutch et al., "Mechless Moly–Mask", IBM Technical Disclosure Bulletin, vol. 12, No. 12, pp. 2073–2074, May 1990.

*Primary Examiner*—Brian K. Talbot
*Attorney, Agent, or Firm*—Graham & James LLP

[57] ABSTRACT

An apparatus and process for forming at least one electrode of an electronic component includes the steps of preparing a work; placing a mask on a principal plane of the work; and applying an electrode material over the mask onto the principal plane of the work to form at least one electrode. The mask preferably comprises, for instance, a first masking portion having a substantially rectangular loop shape and a second masking portion having a substantially rectangular shape, and four pseudo masking portions shaped into substantially rectangular strips and which support the first masking portion. In this case, four through holes are formed in the masking member by the synergistic function of the first masking portion, the second masking portion, and the pseudo masking portions.

5 Claims, 7 Drawing Sheets

APPARATUS AND PROCESS FOR FORMING ELECTRODES OF ELECTRONIC COMPONENTS

BACKGROUND OF THE INVENTION

1. Field of the Invention

The present invention relates to a process for forming an electrode of an electronic component and an apparatus for use in the process. More particularly, the present invention relates to an apparatus and a process for forming an electrode of an electronic component such as a ceramic oscillator, a ceramic filter or other suitable electronic component.

2. Description of Related Art

A known process for forming an electrode pattern on a substrate of an electronic component includes the step of forming a desired electrode pattern on the surface of the substrate by sputtering or performing vapor deposition, using, for example, a mask plate made of a metal. According to this type of process for forming an electrode pattern, a mask plate having through-holes corresponding to a desired electrode pattern is attached to one of the principal planes of the substrate, and sputtering is performed on the mask plate from the upper side thereof so that the electrode material passes through the through-holes and adheres to the surface of the substrate to form a film electrode. As a result, a desired electrode pattern is formed on one of the principal planes of the substrate in this manner.

Another known process for forming an electrode pattern includes the step of forming a film electrode on an entire surface of one of the principal planes of the substrate by sputtering or performing vapor deposition, and then removing the unnecessary electrode portions from the substrate by printing or etching to thereby form the desired electrode pattern.

Using the former process described above for forming an electrode pattern using a mask plate, it is difficult to form, for example, a ring-like electrode pattern, i.e., an electrode pattern comprising an electrode-free portion surrounded by an electrode portion.

The latter process described above for forming an electrode pattern, which includes the step of forming a film electrode on the entire surface of the substrate and then printing or etching the undesired electrode portions can only achieve low productivity, because this process requires the additional steps of printing or etching the undesired electrode portions. Moreover, there is a danger of damaging the surface of the substrate during the etching, printing or other steps for removing the undesired portions of the film electrode, and of damaging the electrical characteristics of the resulting product. In addition, there is a danger that the etching treatment produces a deteriorated electrode layer on the surface of the substrate.

Furthermore, in both known processes for forming an electrode pattern described above, it has been determined that the processes require performing the film deposition step two or more times to vary the thickness of the film electrode that is deposited on the surface of the substrate. That is, the processes are complicated because of the need to perform many additional steps. Thus, in the processes described above, it is difficult to easily and accurately form electrodes having differing film thickness on the same surface of a substrate.

SUMMARY OF THE INVENTION

To overcome the aforementioned problems, the preferred embodiments of the present invention provide a simple and labor-saving process for forming an electrode of an electronic component and for accurately and easily forming electrodes having differing film thicknesses, and provide an apparatus for use in the process.

According to a first preferred embodiment of the present invention, there is provided a process for forming at least one electrode of an electronic component, comprising the steps of preparing a work; placing a mask on a principal plane of the work; and applying an electrode material over the mask onto the principal plane of the work to form the at least one electrode, the mask including at least one through-hole extending from one of the principal planes of the mask to the other principal plane of the mask, at least one masking portion that is brought into contact with a predetermined portion of the work to completely shield the predetermined portion of the work, and at least one pseudo masking portion that is formed such that a bottom surface thereof is located at a distance from a bottom surface of the at least one masking portion to thereby pseudo mask or partially mask the predetermined portion of the work.

In accordance with a second preferred embodiment of the present invention, there is provided an apparatus for forming at least one electrode of an electronic component by adhering an electrode material to form at least one electrode on the work using a mask, the mask comprising at least one through-hole extending from one of the principal planes of the mask to the other principal plane of the mask, at least one masking portion that is brought into contact with a predetermined portion of the work to completely shield the predetermined portion of the work, and at least one pseudo masking portion that is formed to have a bottom surface located at a distance from a bottom surface of the at least one masking portion to thereby pseudo mask or partially mask the predetermined portion of the work.

In the preferred embodiments of the present invention, it is preferred that the mask is formed in such a manner that a ratio b/a is less than 3, where a represents a distance between a bottom surface of the at least one pseudo masking portion and a bottom surface of the at least one masking portion, and b represents the width of the at least one pseudo masking portion.

The mask according to a preferred embodiment of the present invention may comprise a plurality of pseudo masking portions. In such a case, the plurality of pseudo masking portions may be arranged in an array pattern or in a lattice structure.

According to another preferred embodiment of the present invention, there is provided a process for forming at least one electrode of an electronic component, comprising the steps of preparing a work; placing a mask on an upper surface of the work; and applying an electrode material over the mask onto the upper surface of the work to form at least one electrode, the mask comprising at least one through-hole extending from one of the principal planes of the mask to the other principal plane of the mask and at least one pseudo masking portion that is formed to have a bottom surface located at a distance from a bottom surface of the mask in a thickness direction of the mask to thereby pseudo mask or partially mask the predetermined portion of the work; the mask being formed in such a manner that a ratio b/a is equal to or greater than 3, where a represents a distance between the bottom surface of the at least one pseudo masking portion and a bottom surface of the mask, and b represents the width of the at least one pseudo masking portion.

In accordance with still another preferred embodiment of the present invention, there is provided an apparatus for forming at least one electrode of an electronic component by adhering an electrode material to form at least one electrode on the work using a mask, the mask comprising at least one through-hole extending from one of the principal planes of the mask to the other principal plane of the mask and at least one pseudo masking portion having a bottom surface that is formed at a distance from a bottom surface of the mask in the thickness direction of the mask to thereby pseudo mask or partially mask the predetermined portion of the work, the mask being formed in such a manner that the ratio b/a is equal to or greater than 3, where a represents the distance between the bottom surface of the at least one pseudo masking portion and a bottom surface of the mask, and b represents the width of the at least one pseudo masking portion.

In accordance with yet another preferred embodiment of the present invention, there is provided a process for forming at least one electrode of an electronic component, comprising the steps of preparing a work; placing a mask on a principal plane of the work; and applying an electrode material over the mask onto the principal plane of the work to form at least one electrode, the mask including at least one through-hole extending from one of the principal planes of the mask to the other principal plane of the mask and at least one pseudo masking portion that is formed such that a bottom surface thereof is located at a distance from a bottom surface of the mask in a thickness direction of the mask to thereby pseudo mask or partially mask the predetermined portion of the work, the at least one pseudo masking portion comprising a first pseudo masking portion which is formed in such a manner that the ratio b/a is less than 3, and a second pseudo masking portion which is formed in such a manner that the ratio b/a is equal to or greater than 3, where a represents a distance between a bottom surface of a respective one of the first and second pseudo masking portions and a bottom surface of the mask, and b represents the width of the respective one of the first and second pseudo masking portions.

In accordance with a further preferred embodiment of the present invention, there is provided an apparatus for forming at least one electrode of an electronic component by adhering an electrode material to form at least one electrode on the work using a mask, the mask including at least one through-hole extending from one of the principal planes of the mask to the other principal plane of the mask and at least one pseudo masking portion that is formed to have a bottom surface located at a distance from a bottom surface of the mask in a thickness direction of the mask to thereby pseudo mask the predetermined portion of the work; the at least one pseudo masking portion comprising a first pseudo masking portion which is formed in such a manner that the ratio b/a is less 3 than, and a second pseudo masking portion which is formed in such a manner that the ratio b/a is equal to or greater than 3, where a represents the distance between a bottom surface of a respective one of the first and second pseudo masking portions and a bottom surface of the mask, and b represents the width of the respective one of the first and second pseudo masking portions.

In the process according to at least one preferred embodiment of the present invention, the electrode material passes through the at least one through-hole and adheres on the principal plane of the work being exposed by the at least one through-hole. The masking portion is brought into contact with a predetermined portion of the principal plane of the work and completely shields the predetermined portion of the principal plane of the work so that the electrode material does not adhere thereto. The at least one pseudo masking portion supports and reinforces the masking portion. Furthermore, when the electrode material passes through the-through-hole, the electrode material interposes between the at least one pseudo masking portion and the principal plane of the work, and the electrode material adheres to the portion of the principal plane of the work that is disposed opposite to the at least one pseudo masking portion.

Thus, the electrode material adheres on the principal plane of the work in correspondence with the desired electrode pattern to accurately and easily form at least one film electrode. At this time, the portion of the principal plane of the work that is disposed opposite to the at least one pseudo masking portion is shielded partially by the at least one pseudo masking portion which is located at a distance from the bottom surface of the mask and the upper surface of the work. Accordingly, less electrode material adheres to the portion of the work opposed to the at least one pseudo masking portion as compared with the electrode material adhered on the principal plane of the work exposed by the through-hole. Hence, the film thickness of the electrode material adhered to the portion of the work disposed opposite to the pseudo masking portion is thinner than the film thickness of the electrode material adhered to the principal plane of the work exposed by the throughhole.

If the mask is formed in such a manner that a ratio of the width b of the at least one pseudo masking portion to the distance a between the bottom surface of the at least one pseudo masking portion and the bottom surface of the mask, b/a, is preferably less than 3, the electrode material interposes between the at least one pseudo masking portion and the principal plane of the work so as to make certain that a desired thickness of the film electrode is formed by the electrode material and adhered to the predetermined portion of the principal plane of the work disposed opposite to the at least one pseudo masking portion.

Moreover, when a plurality of pseudo masking portions are provided in an array arrangement or in a lattice arrangement, the electrode material interposed between the pseudo masking portions and the principal plane of the work adheres flat to the predetermined portion of the principal plane of the work. In this case, a larger part of the principal plane of the work can be disposed opposite to the pseudo masking portion as compared with the case when a simple pseudo masking portion is used. Accordingly, the adhesion area of the electrode material increases, and, as a result, the electrode material adheres more flatly to the principal plane of the work.

When the mask is formed in such a manner that the mask comprises a second pseudo masking portion in which a ratio of the width b of the second pseudo masking portion to the distance a between the bottom surface of the second pseudo masking portion and the bottom surface of the mask, b/a, is equal to or greater than 3, the electrode material cannot extend to the predetermined portion of the principal plane of the work disposed opposite to the second pseudo masking portion. That is, the electrode material does not adhere to this predetermined portion of the principal plane of the work. Thus, the second pseudo masking portion formed in such a manner that b/a is equal to or greater than 3 can selectively shield the predetermined portion of the work.

These and other elements, features, and advantages of the preferred embodiments of the present invention will be apparent from the following detailed description of the preferred embodiments of the present invention, as illustrated in the accompanying drawings.

DETAILED DESCRIPTION OF PREFERRED EMBODIMENTS

Figure 1:
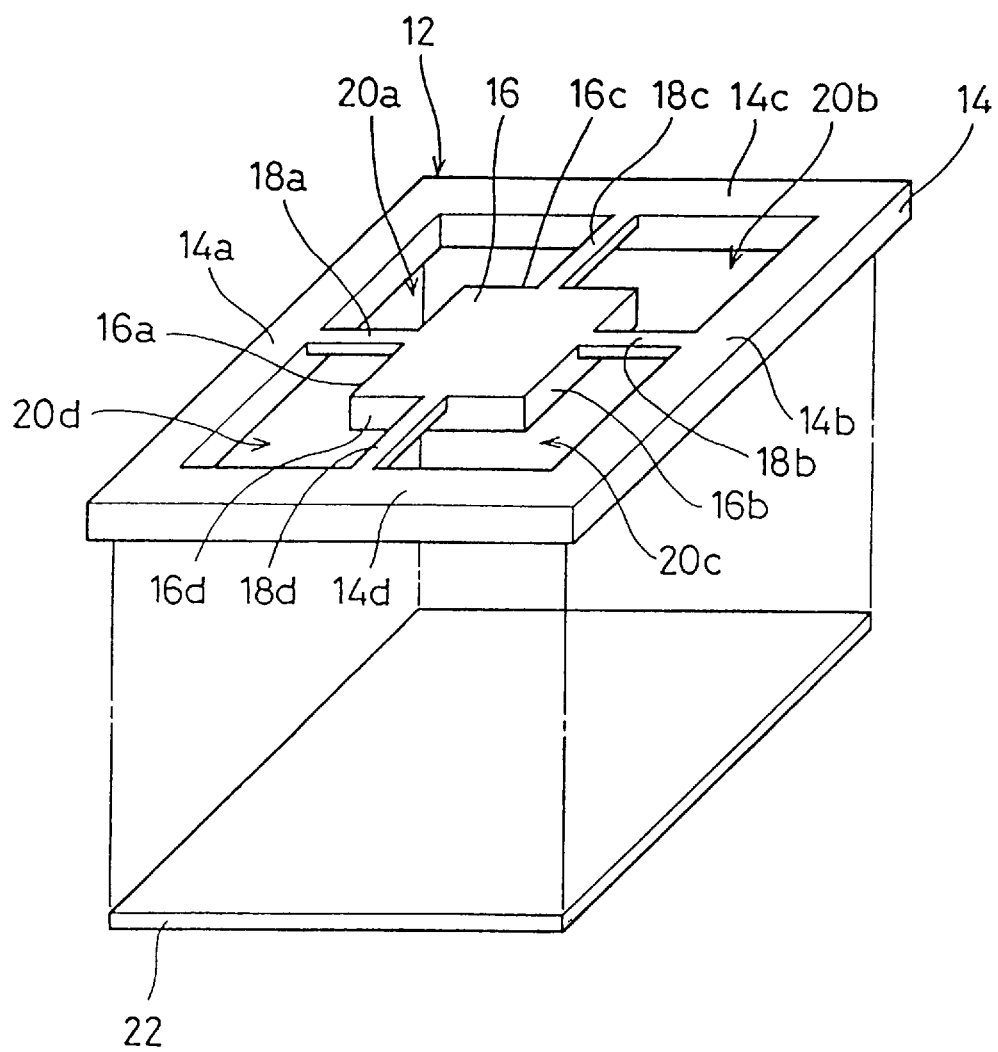
FIG. 1 is an exploded perspective view of a method and masking member apparatus according to a preferred embodiment of the present invention.

The present invention is described in further detail below referring to preferred embodiments according to the present invention and to the attached drawings. It should be understood, however, that the present invention is not to be construed as being limited thereto. In the description of the different preferred embodiments, like reference numerals indicate like elements to avoid repetitive description.

Figure 2:
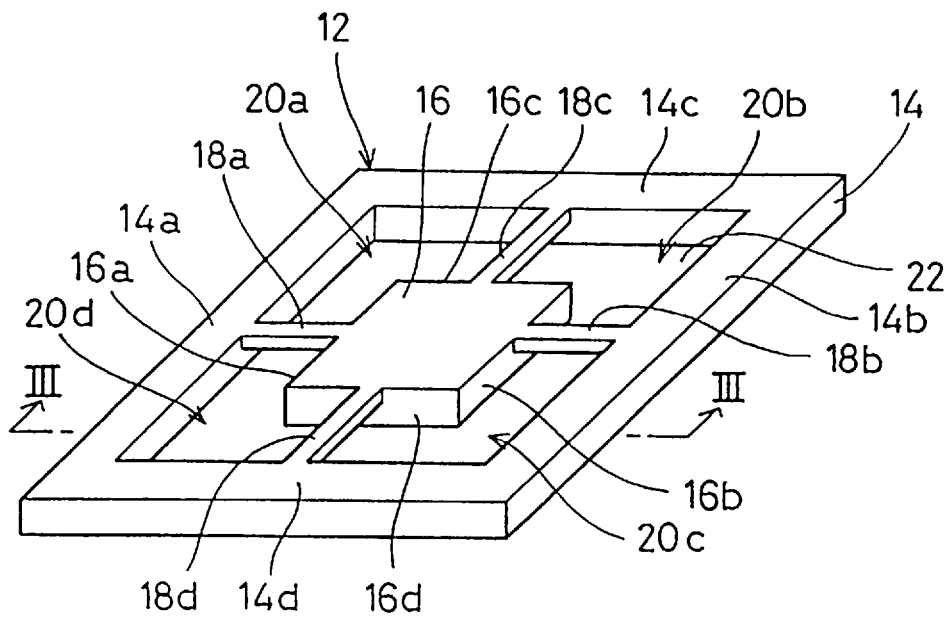
FIG. 2 is a perspective view of the masking member apparatus according to a preferred embodiment of the present invention.
Figure 3:
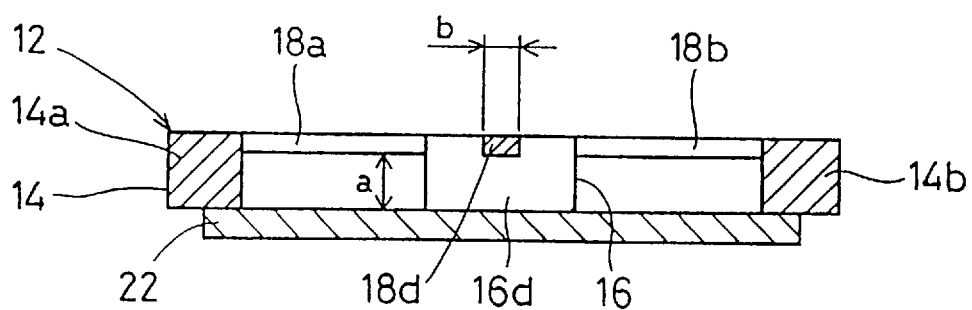
FIG. 3 is a cross section taken on line III—III of FIG. 2.

FIG. 1 is an exploded perspective view of a method and masking member apparatus according to a preferred embodiment of the present invention; FIG. 2 is a perspective view of the method and masking member apparatus according to a preferred embodiment of the present invention; and FIG. 3 is a cross section taken on line III—III of FIG. 2. In the description below, the apparatus for use in the process for forming at least one electrode of an electronic component according to the preferred embodiments of the present invention is described first.

Referring to FIG. 1, an apparatus 10 comprises a masking member 12 for use as a mask. The masking member 12 preferably comprises a first masking portion 14 provided in the shape of, for instance, a substantially rectangular loop. The masking member 12 also preferably includes a second masking portion 16 preferably formed as, for example, a substantially rectangular portion, which is located approximately at the center portion of the first masking portion 14. The second masking portion 16 is preferably supported by the first masking portion 14, for instance, by four pseudo masking portions 18a, 18b, 18c, and 18d. That is, the edge on the inner peripheral side of the first masking portion 14 and the edge on the outer peripheral side of the second masking portion 16 are connected at a distance from each other by the four pseudo masking portions 18a, 18b, 18c and 18d.

The four pseudo masking portions 18a, 18b, 18c and 18d are each formed to preferably have a substantially rectangular shape. One pseudo masking portion 18a, is preferably located between one major side portion 14a of the first masking portion 14 and one major side portion 16a of the second masking portion 16 disposed opposite to the major side portion 14a. One end of the pseudo masking portion 18a is fixed to the upper portion of the inner peripheral edge of the first masking portion 14 at approximately the center portion of the major side portion 14a thereof, and the other end of the pseudo masking portion 18a is fixed to the upper portion of the inner peripheral edge of the second masking portion 16 at approximately the center portion of the major side portion 16a thereof.

That is, the four pseudo masking portions 18a, 18b, 18c and 18d are each preferably formed to extend a predetermined distance between one inner edge of the first masking portion 14 and from one inner edge of the second masking portion 16.

The upper planar surface of the pseudo masking portion 18a and the upper planar surfaces of the first masking portion 14 and the second masking portion 16 are formed such that they are disposed in a common plane. However, the bottom planar surfaces of the pseudo masking portion 18a and the bottom planar surfaces of the first and second masking portions 16 and 18 are not disposed in a common plane as described below.

Similar to the pseudo masking portion 18a, the pseudo masking portion 18b is preferably located between the other major side portion 14b of the first masking portion 14 and the other major side portion 16b of the second masking portion 16 disposed opposite to the major side portion 14b. One end of the pseudo masking portion 18b is fixed to the upper portion of the inner peripheral edge of the first masking portion 14 at approximately the center portion of the major side portion 14b thereof, and the other end of the pseudo masking portion 18b is fixed to the upper portion of the inner peripheral edge of the second masking portion 16 at approximately the center portion of the major side portion 16b thereof.

The pseudo masking portion 18c is preferably located between one minor side portion 14c of the first masking portion 14 and one minor side portion 16c of the second masking portion 16 disposed opposite to the minor side portion 14c. One end of the pseudo masking portion 18c is fixed to the upper portion of the inner peripheral edge of the first masking portion 14 at approximately the center portion of the minor side portion 14c thereof, and the other end of the pseudo masking portion 18c is fixed to the upper portion of the inner peripheral edge of the second masking portion 16 at approximately the center portion of the minor side portion 16c thereof.

The pseudo masking portion 18d is preferably located between the other minor side portion 14d of the first masking portion 14 and the other minor side portion 16d of the second masking portion 16 disposed opposite to the minor side portion 14d. One end of the pseudo masking portion 18d is fixed to the upper portion of the inner peripheral edge of the first masking portion 14 at approximately the center portion of the minor side portion 14d thereof, and the other end of the pseudo masking portion 18d is fixed to the upper portion of the inner peripheral edge of the second masking portion 16 at approximately the center of the minor side portion 16d thereof.

As clearly seen in FIG. 3, a bottom surface of each of the pseudo masking portions 18a, 18b and 18d (also 18c although not visible in FIG. 3) is located at a distance a from a bottom surface of the masking portions 14 and 16 and an upper surface of the substrate 22.

When a masking member 12 is attached to a substrate 22, which is described hereinafter, as is shown in FIG. 3 in accordance with a preferred embodiment of the present invention, in particular, the masking member 12 is constructed in such a manner that a ratio b/a is preferably less than 3, where a represents the distance in a thickness direction between a bottom surface of each of the masking portions 14, 16 and a bottom planar surface of each of the pseudo masking portions 18a, 18b, 18c and 18d, and b represents the width of each of the pseudo masking portions 18a, 18b, 18c and 18d.

In the masking member 12, the first masking portion 14, the second masking portion 16, and the four pseudo masking portions 18a, 18b, 18c and 18d cooperate to form, for instance, four planar through-holes 20a, 20b, 20c, and 20d each having an approximately L shape. The first masking portion 14, the second masking portion 16, and the four pseudo masking portions 18a, 18b, 18c and 18d are preferably formed monolithically by using a metallic material such as stainless steel, for example.

Furthermore, the pseudo masking portions 18a, 18b, 18c and 18d may be formed to be thinner than a thickness of the first masking portion 14 and the second masking portion 16 by, for example, half-etching these portions during the shaping process of the masking member 12.

In general, the mask is preferably formed by first coating both planes of the mask plate with a resist corresponding to the desired mask pattern and performing the etching process from the both sides. The term "half-etching" as referred to herein means coating each of the planes with resists differing in shapes, and performing the etching process partially from only one plane.

In the example according to a preferred embodiment of the present invention, the distance a in the thickness direction of the first masking portion 14 or the second masking portion 16 between a bottom surface of each of the first and second masking portions 14, 16 and a bottom surface of each of the pseudo masking portions 18a, 18b, 18c and 18d and the width b of each of the masking portions 18a, 18b, 18c and 18d are preferably set such that the ratio b/a is less than 3.

A process for forming an electrode of an electronic component using the apparatus 10 equipped with the aforementioned masking member 12 is described below by making reference to FIGS. 1 to 3. In the example according to a preferred embodiment of the present invention, for instance, a known glow discharge sputtering apparatus equipped with a masking member 12 is used.

First of all, for instance, a substantially rectangular planar substrate 22 is prepared as the work. The substrate 22 may be made of, for example, a piezoelectric ceramic or other suitable material.

A masking member 12 is attached to one of the principal planes of the substrate 22. That is, the first masking portion 14 and the second masking portion 16 of the masking member 12 are brought into direct contact with one of the principal planes of the substrate 22 such that the masking portions 14 and 16 completely cover the predetermined portions of the principal plane of the substrate 22. A spacing of a is defined between a bottom surface of each of the pseudo masking portions 18a, 18b, 18c and 18d having a width of b and an upper surface of the substrate 22.

The substrate 22, to which the masking member 12 is provided, is then located at an anode portion of the glow discharge sputtering apparatus.

The glow discharge sputtering apparatus is then operated to irradiate the cathode portion target made of the electrode material with the positive ions generated by the glow discharge. Thus, the electrode material is evaporated by the colliding positive ions, so that the particles of the electrode (referred to simply hereinafter as "electrode particles") may adhere to the substrate 22 having the masking member 12 attached thereto.

Figure 4:
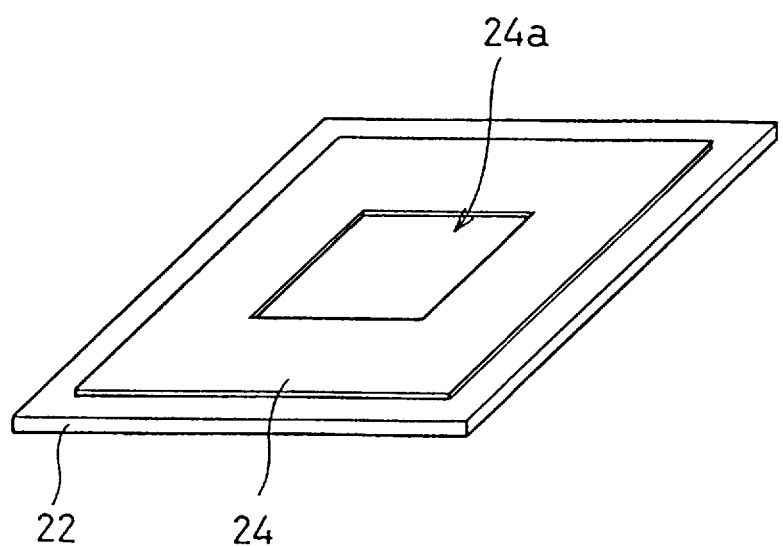
FIG. 4 is a perspective view of an example of an electrode pattern formed according to a process of a preferred embodiment of the present invention.

In the present case, the electrode particles pass through the through-holes 20a, 20b, 20c and 20d of the masking member 12, and adhere to the predetermined portion corresponding to the through-holes 20a, 20b, 20c and 20d on one of the principal planes of the substrate 22 to form at least one film electrode. Furthermore, the electrode particles extend into the spaces between each of the pseudo masking portions 18a, 18b, 18c and 18d and the upper surface of the substrate 22 to form at least one film electrode. As a result, for example, as is shown in FIG. 4, a substantially rectangular loop electrode pattern 24 having an electrode-free portion 24a in the center thereof is formed in correspondence with the desired electrode pattern.

According to the process above for forming at least one electrode of an electronic component using an apparatus 10 equipped with a masking member 12, a loop electrode pattern having an electrode-free portion can be easily fabricated simultaneously via film deposition. Furthermore, because it is not necessary to remove the unnecessary electrode portion by means of printing, etching, or other electrode removal steps in the process according to the preferred embodiments of the present invention, these printing and etching steps can be eliminated from the process. Thus, the productivity can be increased as compared with the prior art processes which require the printing and etching steps. Furthermore, the electrical characteristics of the electronic components can be maintained unimpaired and unaffected, because the damage to the substrate 22 caused by etching or electrode material removal is prevented from occurring.

In the process for forming at least one electrode of an electronic component described above, a masking member 12 according to the preferred embodiments of the present invention has been applied to the so-called sputtering process using a glow discharge sputtering apparatus. However, it may be applied to other processes, for example, vapor deposition or other electrode forming processes.

Figure 5:
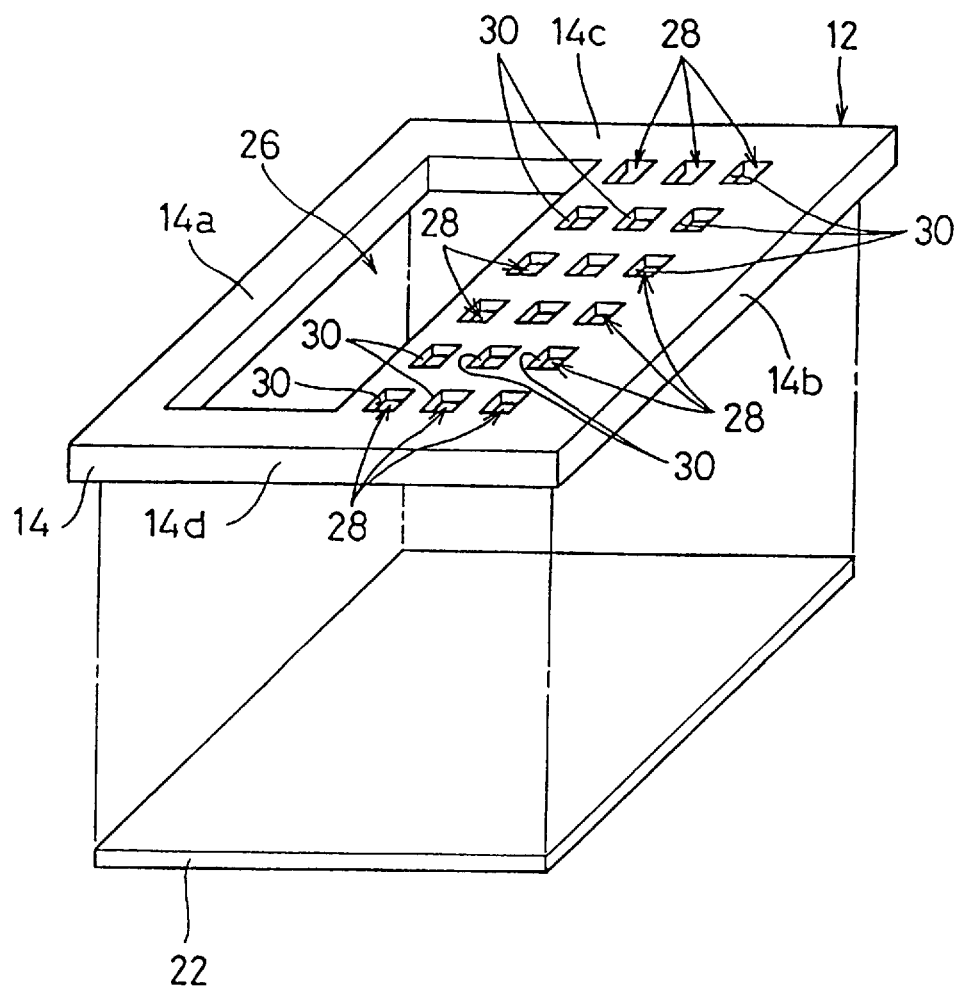
FIG. 5 is an exploded perspective view of a method and masking member apparatus according to another preferred embodiment of the present invention.
Figure 6:
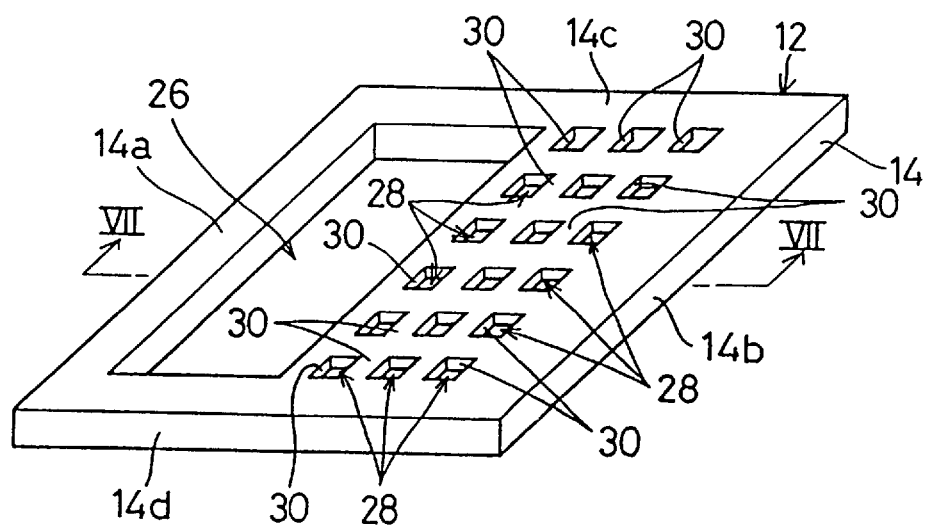
FIG. 6 is a perspective view of the masking member apparatus according to another preferred embodiment of the present invention.
Figure 7:
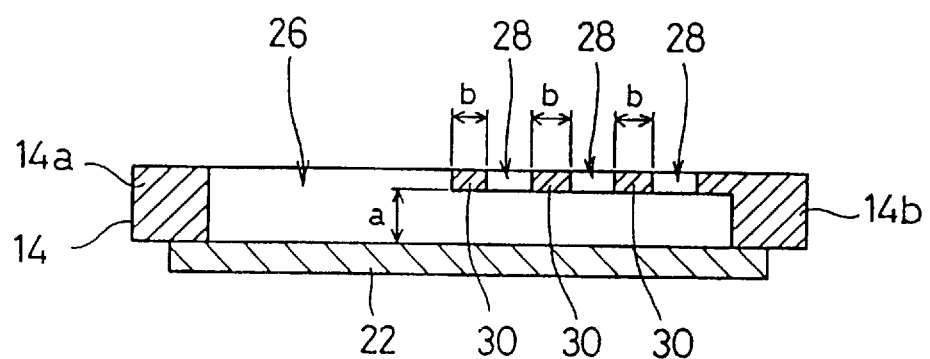
FIG. 7 is a cross section taken on line VII—VII of FIG. 6.

FIG. 5 is an exploded perspective view of a method and masking member apparatus according to another preferred embodiment of the present invention; FIG. 6 is a perspective view of the method and masking member apparatus according to another preferred embodiment of the present invention; FIG. 7 is a cross section taken on line VII—VII of FIG. 6. When compared with the example of the preferred embodiment of the present invention shown in FIGS. 1 to 3, the example according to another preferred embodiment of the present invention has no second masking portion 16, but a plurality of pseudo masking portions are preferably arranged vertically and horizontally in a lattice arrangement.

In the process for forming an electrode of an electronic component using a masking member 12 as is shown in FIGS. 5 to 7, a substrate 22 is first prepared as a work. Then, the masking member 12 as is shown in FIGS. 5 to 7 is attached to the substrate 22. Similar to the example according to the preferred embodiment of the present invention shown in FIGS. 1 to 3, the substrate 22 equipped with the masking member 12 is set to, for example, the anode portion of a glow discharge sputtering apparatus, and is subjected to a sputtering process.

Figure 8:
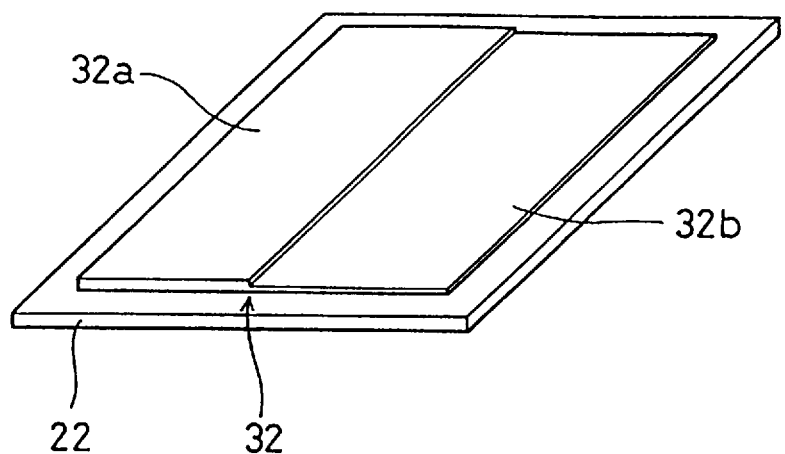
FIG. 8 is a perspective view of yet another example of an electrode pattern formed according to a process of a preferred embodiment of the present invention.

The electrode particles pass through a first through-hole 26 and a plurality of second through-holes 28 provided in the masking member 12, and adhere to the predetermined portions of one of the principal planes of the substrate corresponding to the first through-hole 26 and the second through-holes 28. Furthermore, the electrode particles interpose between one of the principal planes of the substrate 22 and the plurality of pseudo masking portions 30, 30 . . . , 30, and adhere to the surface of the substrate 22 disposed opposite to the pseudo masking portion 30 to form at least one film electrode. As a result, for example, a substantially rectangular electrode pattern 32 as is shown in FIG. 8 is formed on one of the principal planes of the substrate 22.

That is, after passing through the first through-hole 26, a first film electrode 32a is formed on the substrate 22 as a result of being exposed in correspondence with the first through-hole 26. Furthermore, after passing through a plurality of second through-holes 28, a second film electrode 32b is formed on the substrate 22 as a result of being exposed in correspondence with the second through-holes 28, and interposes between the lattice arrangement of the pseudo masking portion 30 and the substrate 22 to form a second film electrode 32b on the predetermined portion of the substrate 22 disposed opposite to the lattice arrangement of the pseudo masking portion 30.

In this case, the plurality of pseudo masking portions 30 are preferably constructed such that a ratio b/a is less than 3, where a represents the distance between a bottom surface of each of the plurality of the pseudo masking portions 30 and a bottom surface of the first masking portion 14, and b represents the width of each of the pseudo masking portions. Moreover, because the plurality of the pseudo masking portions 30 are provided in a lattice arrangement, the second film electrode 32b is thinner than the first film electrode 32a. Furthermore, because the plurality of the pseudo masking portions 30 are arranged horizontally and vertically to make a lattice arrangement, the electrode material interposes between the pseudo masking portion 30 and the substrate 22, and adheres to the substrate 22 such that a second film electrode 32b is thinner and has a uniform thickness. In this case, the plurality of pseudo masking portions 30 are formed such that the film thickness ratio of the first film electrode 32a to the second film electrode 32b that are formed on the substrate 22 is within a desired ratio.

According to the process for forming at least one electrode of an electronic component using an apparatus equipped with a masking member 12 as is shown in FIGS. 5 to 7, electrode patterns differing in film thickness can be easily and accurately formed simultaneously during the film deposition process. Thus, when soldering another electronic component on the substrate, for instance, the difference in film thickness can be used positively. That is, the film thickness of the soldered portion alone can be increased to improve the resistance of the portion against solder leach while maintaining a desired film thinness of the other portions so as to suppress the thermal influence during the film deposition. Furthermore, when the preferred embodiments of the invention are applied to a ceramic oscillator, partial addition of mass to the vibrating electrode portion can be achieved. Thus, special electrical characteristics can be easily obtained.

According to the process of the preferred embodiments drawn in FIGS. 5 to 7, furthermore, an electrode pattern having differing film thicknesses can be formed on the first substrate 22 by a single film deposition process. Moreover, similar to the process for forming at least one electrode of an electronic component shown in FIGS. 1 to 3, printing and etching process steps are eliminated from the process according to the preferred embodiments of the present invention because it is unnecessary to remove the unwanted electrode portions. Thus, the productivity of the process of the preferred embodiments of the present invention can be greatly improved as compared with a conventional process requiring the use of such additional process steps. Furthermore, the substrate 22 itself can be prevented from being damaged by etching. Thus, an electronic component can be obtained without impairing its electrical characteristics.

When a mask comprising another pseudo masking portion having a b/a ratio equal to or greater than 3 is formed, where a represents the distance between the bottom surface of the pseudo masking portion and the bottom surface of the mask, and b represents the width of the pseudo masking portion, a predetermined portion of the work is selectively shielded by the other pseudo masking portion having the b/a ratio which is equal to or greater than 3. Thus, the electrode material does not extend to the predetermined portion of the principal plane of the work disposed opposite to the other pseudo masking portion. Accordingly, the electrode material does not adhere or form a film electrode on the predetermined portion disposed opposite to the other pseudo masking portion.

Figure 9:
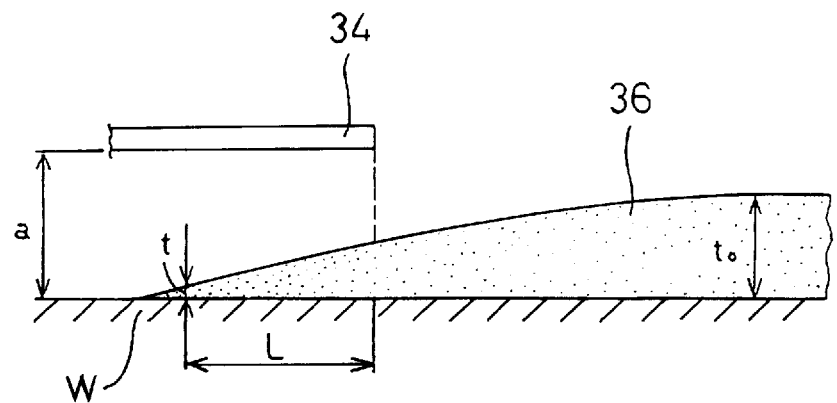
FIG. 9 is an enlarged explanatory view of a method and masking member apparatus showing a state during sputtering, in which the electrode particles extend into a portion corresponding to the shade of the pseudo masking portion and adhere thereto.

The formation of a film electrode by the interposition of an electrode material during sputtering is described below. FIG. 9 is an enlarged explanatory view showing a state during etching, in which a film electrode is formed by the extension of an electrode material into the shaded area of the shielding portion.

When sputtering is performed by using a masking member comprising a shielding portion such as a pseudo masking portion, the electrode material which is discharged by glow discharge and which has a small insertion angle with respect to the space between the shielding portion 34 and the surface of the work W mainly extends into the portion which becomes the shaded area of the shielding portion 34, i.e., into the surface portion of the work W disposed opposite to the shielding portion 34. Some electrode materials change the insertion angle due to the collision with gas ions during the discharge and adhere to the back plane of the shielding portion 34 after extending into the space between the shielding portion 34 and the surface of the work W.

Thus, experiments were performed to determine the relation among the opening a between the shielding portion 34 and the surface of the work W, the distance L from the edge of the shield of the shielding portion 34 to the portion into which the electrode material extends (referred to simply hereinafter as an "extended distance"), the thickness ratio $t/t_0$ (referred to simply hereinafter as a "film thickness ratio"), where t represents the thickness of the film electrode 36 formed at a portion located at an extended distance of L from the shield edge of the shielding portion 34 and $t_0$ represents the thickness of the film electrode 36 formed at a portion having no shielding portion 34. The results are given in TABLE 1 below.

TABLE 1

| a (mm) | L (mm) | L/a | Film thickness ratio ($t/t_0$) |
|---|---|---|---|
| 0.2 | 0.0 | 0.0 | 0.5 |
| 0.2 | 0.1 | 0.5 | 0.3 |
| 0.2 | 0.2 | 1.0 | 0.1 |
| 0.2 | 0.3 | 1.5 | 0.05 |
| 0.6 | 0.0 | 0.0 | 0.5 |
| 0.6 | 0.3 | 0.5 | 0.3 |

TABLE 1-continued

| a (mm) | L (mm) | L/a | Film thickness ratio (t/t₀) |
|---|---|---|---|
| 0.6 | 0.6 | 1.0 | 0.05 |
| 0.6 | 0.9 | 1.5 | 0.0 |

From the experimental data above, it can be seen clearly that the thickness of the film electrode 36 that is formed by the adhesion of the electrode material to the surface portion of the work W disposed opposite to the shielding portion 34 increases with decreasing extended distance L if the opening a is the same. In such a case, a desired film thickness cannot be achieved because the film thickness ratio decreases if L/a is more than 1.5. On the contrary, a desired film thickness can be obtained because the film thickness ratio increases when L/a is less than 1.5. That is, the film thickness of the film electrode 36, which is formed by the adhesion of an electrode material to the surface portion of the work W disposed opposite to the shielding portion 34, is approximately specified by the ratio L/a.

Figure 10:
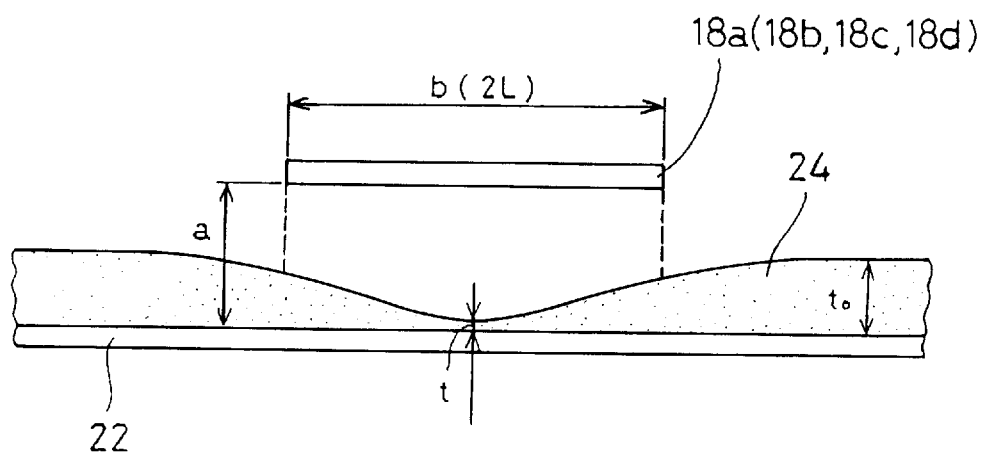
FIG. 10 is an enlarged explanatory view of the method and masking member apparatus showing a state of adhered electrode particles when sputtering is performed using a masking member shown in FIGS. 1, 2, or 3.

If we consider the shielding portion 34, the shielding portion shown in FIG. 10, for instance, in correspondence with each of the pseudo masking portions 18a, 18b, 18c and 18d having a width b as is shown in FIGS. 1 to 3, the electrode material extends from the both sides of each of the pseudo masking portions 18a to 18d. Accordingly, the width b of each of the pseudo masking portions 18a, 18b, 18c and 18d is replaced by 2L. In this case, the thickness of the film electrode that is formed at the central portion in the width direction of each of the pseudo masking portions becomes twice the value of L/a obtained from TABLE 1. Then, experiments were performed to obtain the relation among the opening a between each of the pseudo masking portions 18a, 18b, 18c and 18d and the surface of the substrate 22, the width b of each of the pseudo masking portions 18a, 18b, 18c and 18d, and the film thickness ratio t/to. The results are given in TABLE 2 below.

TABLE 2

| a (mm) | b (mm) | b/a | Film thickness ratio (t/t₀) |
|---|---|---|---|
| 0.8 | 0.5 | 0.63 | 0.8 |
| 0.6 | 0.5 | 0.83 | 0.7 |
| 0.4 | 0.5 | 1.25 | 0.5 |
| 0.2 | 0.5 | 2.5 | 0.1 |

From the experimental data above, it can be seen that the thickness ratio becomes approximately 0 when b/a is larger than 3. Thus, the above assumption is verified.

It can be seen from the foregoing that the preferred embodiments of the present invention provides a process for forming at least one electrode of electronic components and an apparatus for use in the process, the process providing a labor-saving production process capable of forming electrodes with differing film thicknesses.

While the invention has been described in detail and with reference to specific preferred embodiments thereof, it will be apparent to one skilled in the art that various changes and modifications can be made therein without departing from the spirit and scope thereof.

What is claimed is:

1. A process for forming at least one electrode of an electronic component, comprising the steps of:

preparing a work;

preparing a mask including two principal planes and at least one through-hole extending from one of the principal planes of the mask to the other principal plane, at least one masking portion adapted to be brought into contact with a predetermined portion of the work to completely shield the predetermined portion of the work, and at least one pseudo masking portion that is formed to have a bottom surface located spaced from a bottom surface of the at least one masking portion in a thickness direction of the mask for partially masking the work when the mask is disposed in contact with the work, the mask being formed such that a ratio b/a is less than 3, where a represents a distance between the bottom surface of the at least one pseudo masking portion and the bottom surface of the at least one masking portion, and b represents a width of the at least one pseudo masking portion;

placing the mask on an upper surface of the work; and applying an electrode material over the mask onto the upper surface of the work by one of a sputtering process and a vapor deposition process to form an electrode on the work.

2. A process for forming an electrode of an electronic component as claimed in claim 1, wherein the step of preparing the mask includes the step of preparing a plurality of pseudo masking portions on the mask.

3. A process for forming an electrode of an electronic component as claimed in claim 1, wherein the step of preparing the mask includes the step of forming a plurality of pseudo masking portions in an array arrangement.

4. A process for forming an electrode of an electronic component as claimed in claim 1, wherein the step of preparing the mask includes the step of forming a plurality of pseudo masking portions in a lattice arrangement.

5. A process for forming an electrode of an electronic component, comprising the steps of:

preparing a work;

preparing a mask including two principal places and at least one through-hole extending from one of the principal places of the mask to the other principal plane, at least one masking portion adapted to be brought into contact with a predetermined portion of the work to shield the predetermined portion of the work, and a first pseudo masking portion which is formed in such a manner that a ratio b/a for the first pseudo masking portion is less than 3 and a second pseudo masking portion which is formed in such a manner that a ratio b/a of the second pseudo masking portions is equal to or greater than 3, where a represents a distance between a bottom surface of a respective one of the first and second pseudo masking portions and a bottom surface of the mask and b represents a width of the respective one of the first and second pseudo masking portions;

placing the mask on the upper surface of the work; and applying an electrode material over the mask onto the upper surface of the work by one of a sputtering process and a vapor deposition process to form an electrode.

* * * * *